United States Patent
Li et al.

(10) Patent No.: US 8,612,826 B2
(45) Date of Patent: Dec. 17, 2013

(54) SYSTEMS AND METHODS FOR NON-BINARY LDPC ENCODING

(75) Inventors: Zongwang Li, Dublin, CA (US); Shaohua Yang, Santa Clara, CA (US); Fan Zhang, Milpitas, CA (US)

(73) Assignee: LSI Corporation, San Jose, CA (US)

( * ) Notice: Subject to any disclaimer, the term of this patent is extended or adjusted under 35 U.S.C. 154(b) by 36 days.

(21) Appl. No.: 13/474,660

(22) Filed: May 17, 2012

(65) Prior Publication Data

US 2013/0311845 A1    Nov. 21, 2013

(51) Int. Cl.
*H03M 13/00* (2006.01)

(52) U.S. Cl.
USPC .......................................... 714/758; 714/781

(58) Field of Classification Search
USPC ......... 714/758, 746, 752, 755–756, 763, 774, 714/779–786, 792, 799, 800, 801, 804, 807, 714/809–810
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |

(Continued)

OTHER PUBLICATIONS

Xiao, et al "Nested Codes with Multiple Interpretations" retrieved from the Internet URL: Http://www.ece.nmsu.edu/-jkliewer/paper/XFKC_CISS06 2006.

(Continued)

*Primary Examiner* — Christine Tu
(74) *Attorney, Agent, or Firm* — Hamilton DeSanctis & Cha

(57) ABSTRACT

The present inventions are related to systems and methods for data processing, and more particularly to systems and methods for data encoding.

20 Claims, 5 Drawing Sheets

(56) References Cited

U.S. PATENT DOCUMENTS

| | | |
|---|---|---|
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson et al. |
| 6,961,888 B2 * | 11/2005 | Jin et al. ............... 714/752 |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song et al. |
| 7,073,118 B2 | 7/2006 | Greenberg |
| 7,093,179 B2 | 8/2006 | Shea |
| 7,117,427 B2 | 10/2006 | Ophir et al. |
| 7,133,228 B2 | 11/2006 | Fung et al. |
| 7,184,486 B1 | 2/2007 | Wu et al. |
| 7,191,378 B2 | 3/2007 | Eroz et al. |
| 7,203,887 B2 | 4/2007 | Eroz et al. |
| 7,308,061 B1 | 12/2007 | Huang et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,415,651 B2 | 8/2008 | Argon |
| 7,502,189 B2 | 3/2009 | Sawaguchi et al. |
| 7,523,375 B2 | 4/2009 | Spencer |
| 7,587,657 B2 | 9/2009 | Haratsch |
| 7,590,168 B2 | 9/2009 | Raghavan et al. |
| 7,607,075 B2 * | 10/2009 | Blankenship et al. ........ 714/800 |
| 7,646,829 B2 | 1/2010 | Ashley et al. |
| 7,702,986 B2 | 4/2010 | Bjerke et al. |
| 7,752,523 B1 | 7/2010 | Chaichanavong et al. |
| 7,779,325 B2 | 8/2010 | Song |
| 7,802,172 B2 | 9/2010 | Vila Casado et al. |
| 7,952,824 B2 | 5/2011 | Dziak et al. |
| 7,958,425 B2 | 6/2011 | Chugg et al. |
| 7,996,746 B2 | 8/2011 | Livshitz et al. |
| 8,018,360 B2 | 9/2011 | Nayak |
| 8,027,607 B2 * | 9/2011 | Kurata et al. ................ 399/69 |
| 8,201,051 B2 | 6/2012 | Tan et al. |
| 8,237,597 B2 | 8/2012 | Liu et al. |
| 8,261,171 B2 | 9/2012 | Annampedu |
| 8,291,284 B2 | 10/2012 | Savin |
| 8,295,001 B2 | 10/2012 | Liu et al. |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^\wedge$m) LPDC Decoders", IEEE Transactions on Circuits and Systemsši: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/213,751, Unpublished (filed Aug. 19, 2011) (Fan Zhang).

U.S. Appl. No. 13/445,848, Unpublished (filed Apr. 12, 2012) (Bruce Wilson).

U.S. Appl. No. 13/340,951, Unpublished (filed Dec. 30, 2011) (Lei Chen).

U.S. Appl. No. 13/369,468, Unpublished (filed Feb. 9, 2012) (Zongwang Li).

U.S. Appl. No. 13/269,852, Unpublished (filed Oct. 10, 2011) (Haitao Xia).

U.S. Appl. No. 13/284,730, Unpublished (filed Oct. 28, 2011) (Fan Zhang).

U.S. Appl. No. 13/295,150, Unpublished (filed Nov. 14, 2011) (Zongwang Li).

U.S. Appl. No. 13/284,767, Unpublished (filed Oct. 28, 2011) (Fan Zhang).

U.S. Appl. No. 13/269,832, Unpublished (filed Oct. 10, 2011) (Haitao Xia).

U.S. Appl. No. 13/227,544, Unpublished (filed Sep. 8, 2011) (Shaohua Yang).

U.S. Appl. No. 13/174,453, Unpublished (filed Jun. 30, 2011) (Johnson Yen).

U.S. Appl. No. 13/186,234, Unpublished (filed Jul. 19, 2011) (Haitao Xia).

U.S. Appl. No. 13/415,326, Unpublished (filed Mar. 8, 2012) (Shaohua Yang).

U.S. Appl. No. 13/174,537, Unpublished (filed Jun. 30, 2011) (Anantha Raman Krishnan).

U.S. Appl. No. 13/296,022, Unpublished (filed Nov. 14, 2011) (Victor Krachkovsky).

U.S. Appl. No. 13/305,551, Unpublished (filed Nov. 28, 2011) (Yang Han).

U.S. Appl. No. 13/227,416, Unpublished (filed Sep. 7, 2011) (Lei Chen).

(56) References Cited

OTHER PUBLICATIONS

U.S. Appl. No. 13/305,510, Unpublished (filed Nov. 28, 2011) (Lei Chen).
U.S. Appl. No. 13/302,119, Unpublished (filed Nov. 22, 2011) (Lei Chen).
U.S. Appl. No. 13/300,078, Unpublished (filed Nov. 18, 2011) (Chung-Li Wang).
U.S. Appl. No. 13/180,495, Unpublished (filed Jul. 11, 2011) (Chung-Li Wang).
U.S. Appl. No. 13/340,974, Unpublished (filed Dec. 30, 2011) (Dan Liu).
U.S. Appl. No. 13/283,549, Unpublished (filed Oct. 27, 2011) (Wu Chang).
U.S. Appl. No. 13/239,683, Unpublished (filed Sep. 22, 2011) (Changyou Xu).
U.S. Appl. No. 13/113,219, Unpublished (filed May 23, 2011) (Yang Han).
U.S. Appl. No. 13/445,878, Unpublished (filed Apr. 12, 2012) (Yu Liao).
U.S. Appl. No. 13/316,741, Unpublished (filed Dec. 12, 2011) (Yang Han).
U.S. Appl. No. 13/316,858, Unpublished (filed Dec. 12, 2011) (Zongwang Li).
U.S. Appl. No. 13/362,409, Unpublished (filed Jan. 31, 2012) (Fan Zhang).
U.S. Appl. No. 13/412,520, Unpublished (filed Mar. 5, 2012) (Fan Zhang).
U.S. Appl. No. 13/426,714, Unpublished (filed Mar. 22, 2012) (Shaohua Yang).
U.S. Appl. No. 13/372,580, Unpublished (filed Feb. 14, 2012) (Fan Zhang).
U.S. Appl. No. 13/422,986, Unpublished (filed Mar. 16, 2012) (Fan Zhang).
U.S. Appl. No. 13/171,615, Unpublished (filed Jun. 29, 2011) (Bradley D. Seago).
U.S. Appl. No. 13/415,430, Unpublished (filed Mar. 8, 2012) (Nayak Ratnakar Aravind).
U.S. Appl. No. 13/327,279, Unpublished (filed Dec. 15, 2011) (Wei Feng).
U.S. Appl. No. 13/433,693, Unpublished (filed Mar. 29, 2012) (Fan Zhang).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. In COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

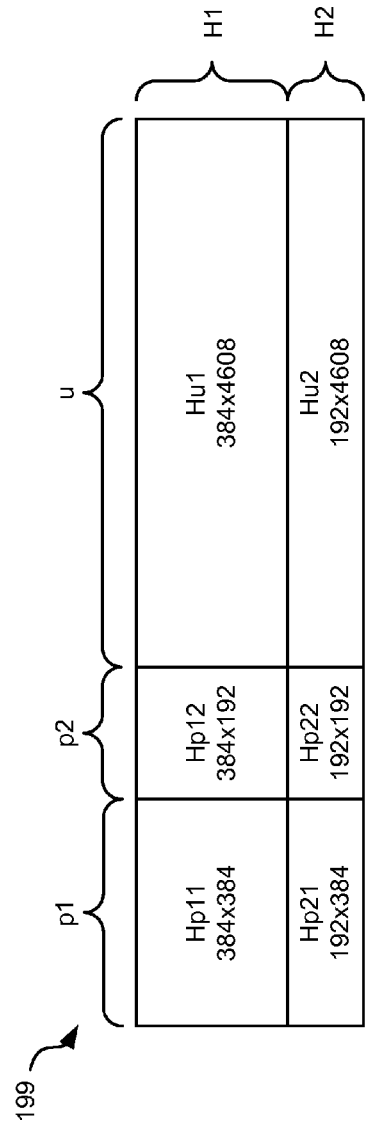

SYSTEMS AND METHODS FOR NON-BINARY LDPC ENCODING

BACKGROUND OF THE INVENTION

The present inventions are related to systems and methods for data processing, and more particularly to systems and methods for data encoding.

Various storage systems include data processing circuitry implemented with a data decoding circuit. In some cases, the data decoding circuit operates on a very large codeword that includes a number of parity bits. As a general rule, the performance of the data decoding circuit is increased where more circuitry is used to implement the circuit. Non-binary decoding has been implemented to improve performance, but in some cases the complexity of such non-binary codes makes corresponding circuitry impractical.

Hence, for at least the aforementioned reasons, there exists a need in the art for advanced systems and methods for non-binary encoding.

BRIEF SUMMARY OF THE INVENTION

The present inventions are related to systems and methods for data processing, and more particularly to systems and methods for data encoding.

Various embodiments of the present invention provide data encoding systems that include a data encoder circuit. The data encoder circuit operable to: multiply a user data input by a first vector to yield a first interim vector; multiply the user data input by a second vector to yield a second interim vector; multiply the first interim vector by a third vector to yield a third interim vector; multiply the third interim vector by a fourth vector to yield a fourth interim vector; and add the fourth interim vector to the second interim vector to yield an output vector. The aforementioned data encoding systems may be implemented, for example, as part of a storage device, or a communication device. In some cases, multiplying the user data input by the first vector to yield the first interim vector is done by a first vector multiplier circuit; multiplying the user data input by the second vector to yield the second interim vector is done by a second vector multiplier circuit; multiplying the first interim vector by the third vector to yield the third interim vector is done by a third vector multiplier circuit; multiplying the third interim vector by the fourth vector to yield the fourth vector is done by a fourth vector multiplier circuit; and adding the fourth interim vector to the second interim vector to yield the output vector is done by a vector adder circuit.

In some instances of the aforementioned embodiments, the output vector corresponds to the following equation:

$$\text{Output Vector} = [(-Hp21 \times Hp11\ Inv \times Hu1 \times u) + (Hu2 \times u)],$$

where u represents the user data, Hu1 represents the first vector, Hu2 represents the second vector, Hp11 Inv represents the third vector, and −Hp21 represents the fourth vector. In some cases, each of Hu1, Hu2, Hp11 Inv and −Hp21 is a sparse circluant matrix.

In various instances of the aforementioned embodiments, the output vector is a first output vector, and the data encoder circuit is further operable to: multiply the first output vector by a fifth vector to yield a fifth interim vector; and multiply the fifth interim vector by a sixth vector to yield a second output vector. In some instances of the aforementioned embodiments, the encoder circuit is further operable to: multiply the first output vector by a fifth vector to yield a fifth interim vector; and multiply the fifth interim vector by a sixth vector to yield a second output vector. In some cases, multiplying the first output vector by the fifth vector to yield the fifth interim vector is done by a first vector multiplier circuit; and multiplying the fifth interim vector by the sixth vector to yield the second output vector is done by a second vector multiplier circuit. In some cases, the sixth vector is a sparse circulant matrix and the fifth vector is a dense circulant matrix. In particular cases, the second output vector corresponds to the following equation:

$$\text{Second Output Vector} = \text{First Output Vector} \times \tilde{H}p22 \times Hp12$$

Where $\tilde{H}p22$ represents the fifth vector, and Hp12 represents the sixth vector.

In various instances of the aforementioned embodiments, the data encoder circuit is further operable to: add the first interim vector to the second output vector to yield a sixth interim vector; and multiply the sixth interim vector by the third vector to yield a third output vector. In some cases, adding the first interim vector to the second output vector to yield a sixth interim vector is done by a vector adder circuit; and multiplying the sixth interim vector by the third vector to yield the third output vector is done by a vector multiplier circuit. In particular cases, the third output vector corresponds to the following equation:

$$\text{Third Output Vector} = (\text{Second Output Vector} + \text{First Interim Vector}) \times Hp11\ Inv),$$

where Hp11 Inv represents the third vector. In one or more cases, the third output vector is a low density parity check codeword.

Other embodiments of the present invention provide methods for multi-stage encoding that include: receiving a user data input at a data encoding circuit; multiplying the user data input by a first vector to yield a first interim vector in the data encoding circuit; multiplying the user data input by a second vector to yield a second interim vector in the data encoding circuit; multiplying the first interim vector by a third vector to yield a third interim vector in the data encoding circuit; multiplying the third interim vector by a fourth vector to yield a fourth interim vector in the data encoding circuit; adding the fourth interim vector to the second interim vector to yield an a fifth interim vector in the data encoding circuit; multiplying the fifth interim vector by a fifth vector to yield a sixth interim vector in the data encoding circuit; multiplying the sixth interim vector by a sixth vector to yield a seventh interim vector in the data encoding circuit; adding the seventh interim vector to the first interim vector to yield an eighth interim vector in the data encoding circuit; and multiplying the eighth interim vector by the third vector to yield an encoded output. In some cases, the encoded output is a low density parity check codeword. In various cases, the encoded output is a non-binary encoded output and in other cases the encoded output is a binary encoded output. In particular instances of the aforementioned embodiments, the methods further comprise: programming a memory accessible to the data encoding circuit to hold the first vector, the second vector, the third vector, the fourth vector, the fifth vector, and the sixth vector. In some cases, the fifth vector is a dense circulant matrix; and each of the first vector, the second vector, the third vector, the fourth vector, and the sixth vector is a sparse circulant matrix.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 1a-1d shows a data encoding circuit including multi-stage non-binary encoding in accordance with one or more embodiments of the present invention;

DETAILED DESCRIPTION OF THE INVENTION

The present inventions are related to systems and methods for data processing, and more particularly to systems and methods for data encoding.

Various embodiments of the present invention provide systems and methods for data encoding. Such systems and methods rely on performing a first level non-binary encoding followed by a second level non-binary encoding to yield a non-binary codeword. This non-binary codeword may then be decoded using a reverse process.

Figures 1A, 1B:
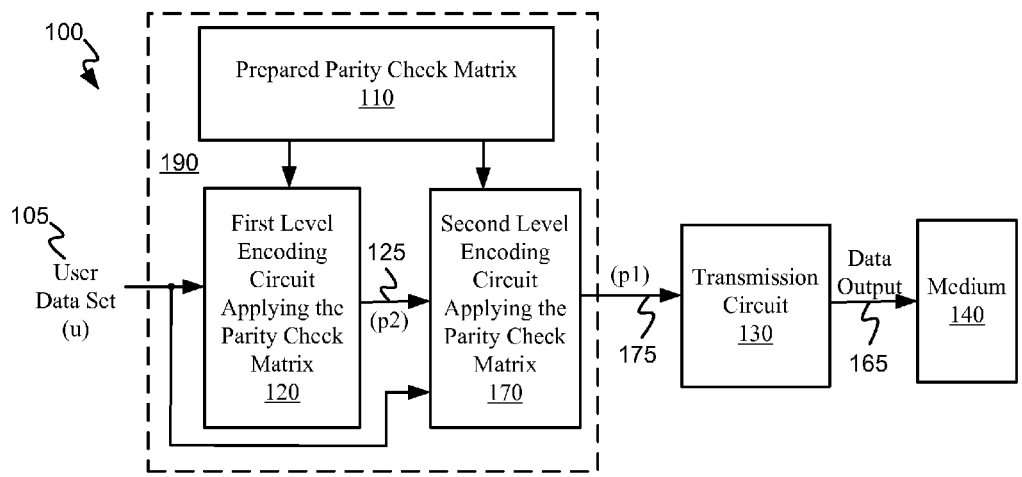

Turning to FIG. 1a, a data encoding circuit 100 is shown that includes multi-stage non-binary encoding in accordance with one or more embodiments of the present invention. Data encoding circuit 100 includes an encoder circuit 190 and a transmission circuit 130. Encoder circuit 190 includes a prepare parity check matrix 110 that includes portions of a parity check matrix used in relation to data encoding, a first level encoding circuit 120, and a second level encoding circuit 170. First level encoding circuit 120 applies a data encoding algorithm to a user data input (u) 105 using portions of the parity check matrix to yield a first level encoded output (p2) 125. First level encoded output 125 is provided to a second level encoding circuit applying another portion of the parity check matrix to yield a second level encoded output (p1) 175. Second level encoded output (p1) 175 is provided as a data output 165 to a medium 140. Medium 140 may be, but is not limited to, a magnetic storage medium, a wireless transmission medium, a wired transmission medium, an optical transmission medium, or the like. Based upon the disclosure provided herein, one of ordinary skill in the art will recognize a variety of medium and combinations of mediums that may be used in relation to different embodiments of the present invention.

Turning to FIG. 1b, an example LDPC codeword 101 such as that provided as second level encoded output (p1) 175 from data encoding circuit 100 is shown. It should be noted that LDPC codeword 101 is merely an example, and that based upon the disclosure provided herein, one of ordinary skill in the art will recognize other sizes (i.e., rows and/or columns) that LDPC codeword 101. As shown, LDPC codeword 101 is arranged as a number of circulants ($P_{i,j}$). Such circulants are matrices where each row vector is rotated one element to the right relative to the preceding row vector. Such circulants reduce the amount of processing that must be applied during a downstream data decoding process. An example of such a circulant is shown as circulant 102 where the element α is rotated through each successive row of thereof. In this case, circulant 102 is a p×p circulant with a weight of one which may be referred to as a permutation matrix. In a binary LDPC code, α is α is a value $2^{-q}$, where q is equal to one (1). In a non-binary LDPC code, α is a value $2^{-q}$, where q is greater than one (1).

Turning to FIG. 1c, an example LDPC encoded output 189 corresponding to second level encoded output (p1) 175 and including an H1 portion and an H2 portion is shown. Each of $P_{i,j}$ are circulants similar to that discussed above in relation to FIG. 1b above. In this example, the size of p1 is 384 parity check equations and the size of p2 is 192 parity check equations. Based upon the disclosure provided herein, one of ordinary skill in the art will recognize other sizes that may be used in relation to different embodiments of the present invention. Turning to FIG. 1d, an example parity check matrix 199 similar to that programmed as prepared parity check matrix 110 is shown. Portions of parity check matrix 199 (i.e., Hp11, Hp12, Hu1, Hp21, Hp22 and Hu2) are used in relation to different portions of the decoding circuitry implemented as first level encoding circuit 120 and second level encoding circuit 170. As discussed below in relation to FIG. 2, some embodiments use matrix portions derived from the portions shown in example parity check matrix 199.

In operation, data encoding circuit 190 applies a first level encoding algorithm to user data input (u) 105. This encoding algorithm includes parity information with user data input (u) 105 such that the following equation is made true:

$$H1 \times C = H1 \times \begin{bmatrix} p1 \\ p2 \\ u \end{bmatrix} \equiv 0, \text{ where } H1 = [\,Hp11 \quad Hp12 \quad Hu1\,].$$

The second level encoding algorithm is applied to user data input (u) 105. This encoding algorithm includes parity information with user data input (u) 105 such that the following equation is made true:

$$H2 \times C = H2 \times \begin{bmatrix} p1 \\ p2 \\ u \end{bmatrix} \equiv 0, \text{ where } H2 = [\,Hp21 \quad Hp22 \quad Hu2\,].$$

In one embodiment of the present invention, Hp11 is a 4×4 circulant with full rank and the inversion of Hp11 (i.e., Hp11 Inv) is a sparse circluant matrix.

Rearranging the combination of the H1 and H2 portions of the above mentioned equations yields the following:

$$(-Hp21 \times Hp11\ Inv \times H1 \times C) + (H2 \times C) \equiv 0;$$

$$[0(-Hp21 \times Hp11\ Inv \times Hp12 + Hp22)\ (-Hp21 \times Hp11\ Inv \times Hu1 + Hu2)] \times C \equiv 0;$$

and $$[0(\tilde{H}p22)\ (-Hp21 \times Hp11\ Inv \times Hu1 + Hu2)] \times C \equiv 0.$$

In some embodiments of the present invention, $\tilde{H}p22$ is a 192×192 sparse matrix. The resulting equation from above can be further expanded as follows:

$$\begin{bmatrix} 0 & (\tilde{H}p22) & (-Hp21 \times Hp11\,Inv \times Hu1 + Hu2) \end{bmatrix} \times \begin{bmatrix} p1 \\ p2 \\ u \end{bmatrix} \equiv 0;$$

where $$\tilde{H}u2 = -Hp21 \times Hp11\,Inv \times Hu1 + Hu2.$$

Figure 2:
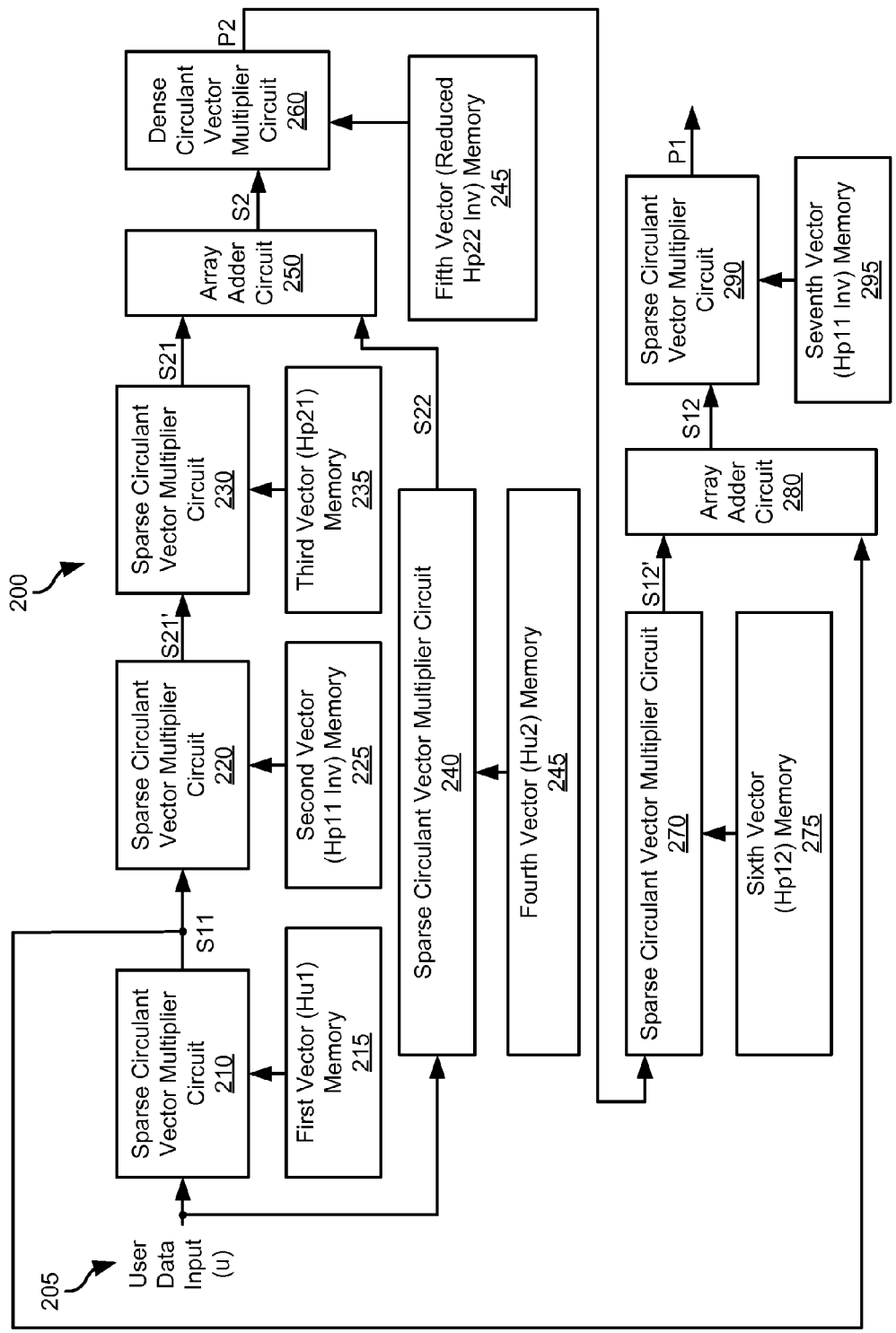
FIG. 2 shows an implementation of a multi-stage non-binary encoding circuit in accordance with one or more embodiments of the present invention.

In some embodiments of the present invention, Hp21, Hp11 Inv, Hu1, and Hu2 are all sparse circulant matrices. If $\tilde{H}p22$ is not a full rank matrix, the full rank base matrix $\tilde{H}p22$ which has the same rank as $\tilde{H}p22$ is found in accordance with the above mentioned equation. In contrast, if $\tilde{H}p22$ is a full rank matrix, the following is true:

It some embodiments of the present invention, the inverse of $\tilde{H}p22$ (i.e., $\tilde{H}p22\,Inv$) may be used to implement encoder circuit 190. Turning to FIG. 2, an implementation of a multi-stage non-binary encoding circuit 200 using inverse matrices is shown in accordance with one or more embodiments of the present invention. Multi-stage non-binary encoding circuit 200 may be used in place of encoder circuit 190 of FIG. 1a. Multi-stage non-binary encoding circuit 200 includes a sparse circulant vector multiplier circuit 210 that multiplies a user data input (u) 205 by an Hu1 parity matrix portion maintained in a first vector memory 215 to yield an interim output S11 in accordance with the following equation:

$$S11 = Hu1 \times u.$$

Hu1 is a sparse matrix in circulant form. In turn, S11 is provided to a sparse circulant vector multiplier circuit 220 that multiplies it by an inverse of an Hp11 parity matrix portion (Hp11 Inv) maintained in a second vector memory 225 to yield an interim output S21' in accordance with the following equation:

$$S21' = Hp11\,Inv \times Hu1 \times u.$$

Hp11 Inv is a sparse matrix in circulant form. In turn, S21' is provided to a sparse circulant vector multiplier circuit 230 that multiplies it by the negative of an Hp21 parity matrix portion (−Hp21) maintained in a third vector memory 235 to yield an interim output S21 in accordance with the following equation:

$$S21 = -Hp21 \times Hp11\,Inv \times Hu1 \times u.$$

−Hp21 is a sparse matrix in circulant form.

In parallel, user data input (u) 205 is provided to a sparse circulant vector multiplier circuit 240 that multiplies it by an Hu2 parity matrix portion maintained in a fourth vector memory 245 to yield an interim output S22 in accordance with the following equation:

$$S22 = Hu2 \times u.$$

The interim outputs S21 and S22 are provided to an array adder circuit 250 that sums the received vectors to yield another interim output S2 in accordance with the following equation:

$$S2 = (-Hp21 \times Hp11\,Inv \times Hu1 \times u) + (Hu2 \times u).$$

Interim output S2 is provided to a dense circulant multiplier circuit 260 that multiplies S2 by an inverse of an $\tilde{H}p22$ parity matrix portion ($\tilde{H}p22\,Inv$) maintained in a fifth vector memory 255 to yield an interim output p2 in accordance with the following equation:

$$P2 = \tilde{H}p22\,Inv \times [(-Hp21 \times Hp11\,Inv \times Hu1 \times u) + (Hu2 \times u)] = -S2.$$

In one particular embodiment of the present invention, $\tilde{H}p22$ Inv is a dense circulant matrix having a reduced size compared with Hp22. For example, where Hp22 is a 192×192 matrix, $\tilde{H}p22$ Inv may be a 96×96 matrix.

Interim output P2 is provided to a sparse circulant vector multiplier circuit 270 that multiplies it by an Hp12 parity matrix portion maintained in a sixth vector memory 275 to yield an interim output S12' in accordance with the following equation:

$$S12' = (Hp12) \times \tilde{H}p22\,Inv \times [(-Hp21 \times Hp11\,Inv \times Hu1 \times u) + (Hu2 \times u)].$$

Interim output S12' is an array adder circuit 280 that sums the received vectors to yield another interim output S12 in accordance with the following equation:

$$S12 = (Hp12) \times \tilde{H}p22\,Inv \times [(-Hp21 \times Hp11\,Inv \times Hu1 \times u) + (Hu2 \times u)] + u.$$

Interim output S12 is then provided to a sparse circulant vector multiplier circuit 290 that multiplies it by an Hp11 Inv parity matrix portion maintained in a seventh vector memory 295 to yield an encoded output P1 in accordance with the following equation:

$$P1 = Hp11\,Inv \times [(Hp12) \times \tilde{H}p22\,Inv \times [(-Hp21 \times Hp11\,Inv \times Hu1 \times u) + (Hu2 \times u)] + u],$$

Which satisfies the equation:

$$\begin{bmatrix} (\tilde{H}p22) & (\tilde{H}u2) \end{bmatrix} \times \begin{bmatrix} p2 \\ u \end{bmatrix} \equiv 0,$$

where $\tilde{H}u2 = -Hp21 \times Hp11\,Inv \times Hu1 + Hu2$.

Accordingly, the implementation of multi-stage non-binary encoding circuit 200 yields the same output as encoder circuit 190.

Figure 3:
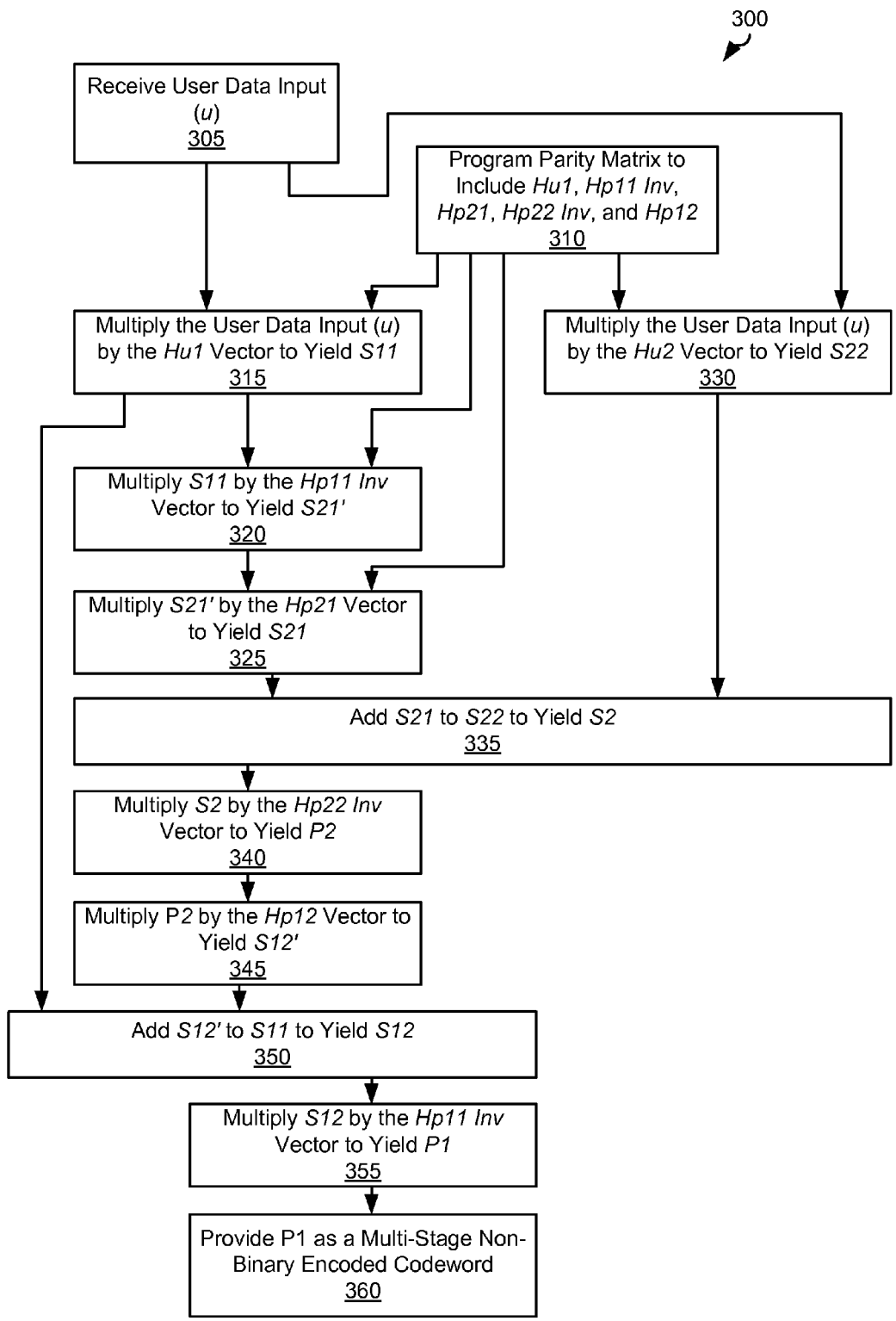
FIG. 3 is a flow diagram showing a method in accordance with some embodiments of the present invention for multi-stage non-binary encoding.

Turning to FIG. 3, a flow diagram 300 shows a method in accordance with some embodiments of the present invention for multi-stage non-binary encoding. Following flow diagram 300, a user data input (u) is received (block 305). This user data input may be received, for example, from a storage medium or a communication medium. Based upon the disclosure provided herein, one of ordinary skill in the art will recognize a variety of sources of the user data input. In addition, a parity matrix is programmed to include parity matrix portions: Hu11, Hp11 Inv, Hp21, $\tilde{H}p22$ Inv and Hp12 (block 310). This programming only needs to be done once, and can be used for all later uses of an encoder circuit as the parity matrix does not change In some embodiments of the present invention, Hp21, Hp11 Inv, Hu1, and Hu2 are all sparse circulant matrices. If $\tilde{H}p22$ is not a full rank matrix, the full rank base matrix $\tilde{H}p22$ which has the same rank as $\tilde{H}p22$ is found in accordance with the above mentioned equation. Alternatively, where $\tilde{H}p22$ is a full rank, the following identity is true:

$$\begin{bmatrix} (\tilde{H}p22) & (\tilde{H}u2) \end{bmatrix} \times \begin{bmatrix} P2 \\ u \end{bmatrix} \equiv 0, \text{ where:}$$

$$\tilde{H}u2 = -Hp21 \times Hp11\,Inv \times Hu1 + Hu2; \text{ and}$$

$$P2 = \tilde{H}p22 \times [(-Hp21 \times Hp11\,Inv \times Hu1 \times u) + (Hu2 \times u)].$$

The user data input (u) is multiplied by the Hu1 parity matrix portion to yield and S11 vector (block 315), and is multiplied by Hu2 to yield an S22 vector (block 330). The S11 vector and the S12 vector are respectively represented by the following equations:

$$S11 = Hu1 \times u; \text{ and}$$

$$S22 = Hu2 \times u$$

In turn, the S11 vector is multiplied by the Hp11 Inv parity matrix portion to yield an S21' vector (block 320) in accordance with the following equation:

$$S21' = Hp11\ Inv \times Hu1 \times u.$$

The S21' vector is multiplied by the negative of the Hp21 parity matrix portion to yield an S21 vector (block 325) in accordance with the following equation:

$$S21 = -Hp21 \times Hp11\ Inv \times Hu1 \times u.$$

The S21 vector is vector added to the S22 vector to yield an S2 vector (block 335) in accordance with the following equation.

$$S2 = [(-Hp21 \times Hp11\ Inv \times Hu1 \times u) + (Hu2 \times u)].$$

The S2 vector is then multiplied by the $\tilde{H}p22$ Inv parity matrix portion to yield a vector P2 (block 340) in accordance with the following equation:

$$P2 = \tilde{H}p22 \times [(-Hp21 \times Hp11\ Inv \times Hu1 \times u) + (Hu2 \times u)].$$

The P2 vector is then multiplied by the Hp12 vector to yield an S12' vector (block 345) in accordance with the following equation:

$$S12' = Hp12 \times \tilde{H}p22 \times [(-Hp21 \times Hp11\ Inv \times Hu1 \times u) + (Hu2 \times u)].$$

The S12' vector is then added to the S11 vector to yield an S12 vector (block 350) in accordance with the following equation:

$$S12 = Hu1 \times u + Hp12 \times \tilde{H}p22 \times [(-Hp21 \times Hp11\ Inv \times Hu1 \times u) + (Hu2 \times u)].$$

The S12 vector is then multiplied by the Hp11 Inv parity matrix portion to yield a vector P1 (block 355) in accordance with the following equation:

$$P1 = Hp11\ Inv \times [Hu1 \times u + Hp12 \times \tilde{H}p22 \times [(-Hp21 \times Hp11\ Inv \times Hu1 \times u) + (Hu2 \times u)]],$$

which is equivalent to:

$$\left[ (\tilde{H}p22)\ (\tilde{H}u2) \right] \times \begin{bmatrix} P2 \\ u \end{bmatrix} \equiv 0, \text{ where:}$$

$$\tilde{H}u2 = -Hp21 \times Hp11\ Inv \times Hu1 + Hu2; \text{ and}$$

$$P2 = \tilde{H}p22 \times [(-Hp21 \times Hp11\ Inv \times Hu1 \times u) + (Hu2 \times u)].$$

The resulting vector P1 is provided as a multi-stage non-binary encoded codeword (block 360). This codeword may be stored to a storage medium or transferred via a transmission medium.

Figure 4:
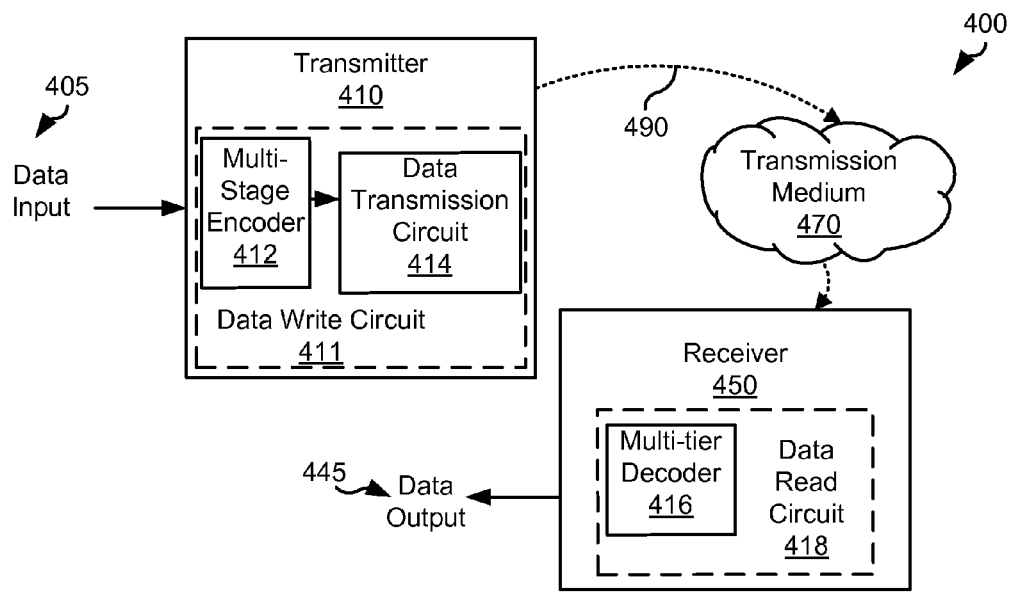
FIG. 4 shows a data transmission system including a transmitter having multi-stage non-binary encoding circuitry in accordance with some embodiments of the present invention.

Turning to FIG. 4, a data transmission system 400 including a transmitter 410 having multi-stage non-binary encoding circuitry is shown in accordance with some embodiments of the present invention. Transmission system 400 may be, for example, two cellular telephones or radio sets. Based upon the disclosure provided herein, one of ordinary skill in the art will recognize a variety of transmission systems that may include the circuitry discussed in relation to FIG. 4. Transmitter 410 includes a multi-stage non-binary encoder circuit 412 in accordance with various embodiments of the present invention, and a data transmission circuit 414. Multi-stage non-binary encoder circuit 412 may be implemented similar to those described above in relation to one or more of FIG. 1a and/or FIG. 2, and/or may operate in accordance with the flow diagram of FIG. 4. Receiver 450 receives data received from transmitter 410 via a transmission medium 470. Receiver 450 includes a data read circuit 418 having a decoder 416. Decoder 416 implements a decode process that substantially reverses the encoding originally applied by multi-stage encoder circuit 412.

In operation, a data input 405 is provided to transmitter 410. Multi-stage non-binary encoder circuit 412 encodes the received data input and provides an encoded output to data transmission circuit 414. Data transmission circuit 414 converts the data into a radio frequency signal 490 that is transmitted via transmission medium 470. Receiver 450 receives the radio frequency signal that is processed by data read circuit 418. Such processing includes data decoding by decoder 416. Ultimately, the decoded data is provided as a data output 445 which corresponds to data input 405.

Figure 5:
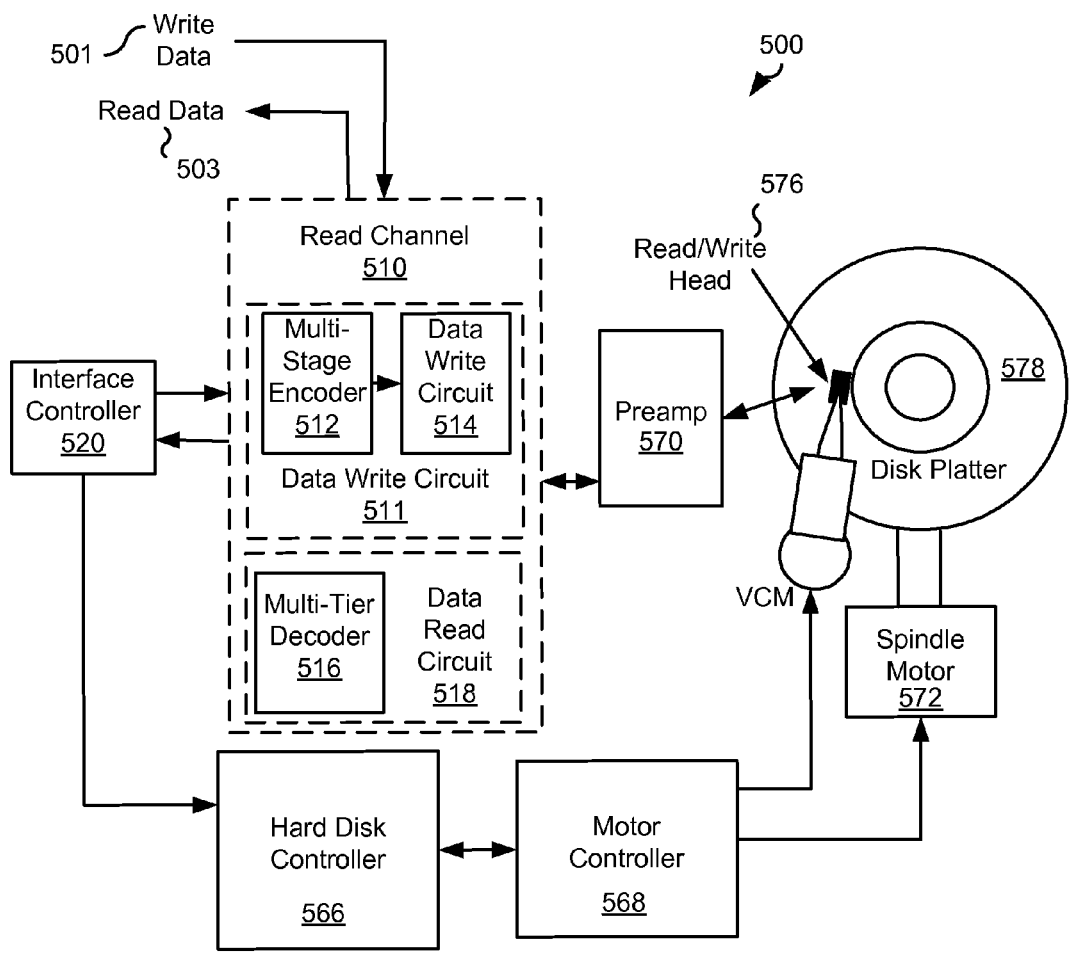
FIG. 5 depicts a data storage system having multi-stage non-binary encoding circuitry in accordance with some embodiments of the present invention.

Turning to FIG. 5, a data storage system 500 having a read channel circuit 510 including a multi-stage non-binary encoding circuitry is shown in accordance with some embodiments of the present invention. In particular, read channel circuit 510 includes a data write circuit 511 and a data read circuit 518. Data storage system 500 may be, for example, a hard disk drive. Based upon the disclosure provided herein, one of ordinary skill in the art will recognize a variety of storage systems that may include the circuitry discussed below in relation to FIG. 1a, FIG. 2, and/or FIG. 3. Data write circuit 511 includes a multi-stage non-binary encoder circuit 512 in accordance with various embodiments of the present invention, and a data write circuit 514. Multi-stage non-binary encoder circuit 512 may be implemented similar to those described above in relation to one or more of FIG. 1a or FIG. 2, and/or may operate in accordance with the flow diagram of FIG. 4. Data read circuit 518 receives data retrieved from a disk platter 578 and performs a data decode process using a decoder 516. The data decode process substantially reverses the encoding originally applied by multi-stage encoder circuit 512.

In addition, data storage system 500 includes a preamplifier 570 that amplifies a minute electrical signal received from a read/write head assembly 576. Read/write head assembly 576 is disposed in relation to disk platter 578. Data storage system 500 also includes an interface controller 520, a hard disk controller 566, a motor controller 568, and a spindle motor 572. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with a perpendicular recording scheme. In other embodiments of the present invention, disk platter 578 includes magnetic signals recorded in accordance with a longitudinal recording scheme.

In a read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to data read circuit 518 of read channel circuit 510 via preamplifier 570. Preamplifier 570 is operable to amplify the minute analog signals accessed from disk platter 578. In turn, data read circuit 518 decodes the received information using decoder 516 as part of a process of digitizing the received analog signal to recreate the information originally written to disk platter 578. This data is provided as read data 503 to a receiving circuit.

A write operation is substantially the opposite of the preceding read operation. In particular, write data 501 is received by data write circuit 511 of read channel circuit 510. Write data 501 is encoded by encoder circuit 512, and the encoded data is provided to a data write circuit 514. Data write circuit 514 drives the encoded data to preamplifier 570. The data amplified by preamplifier 570 are provided to read/write head assembly 576 that generates a corresponding magnetic field that is recorded on disk platter 578 at locations controlled by motor controller 568.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 510 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data encoding system, the system comprising:
 a data encoder circuit operable to:
  multiply a user data input by a first vector to yield a first interim vector;
  multiply the user data input by a second vector to yield a second interim vector;
  multiply the first interim vector by a third vector to yield a third interim vector;
  multiply the third interim vector by a fourth vector to yield a fourth interim vector; and
  add the fourth interim vector to the second interim vector to yield an output vector.

2. The data encoding system of claim 1, wherein the output vector corresponds to the following equation:
 Output Vector=[(−Hp21×Hp11 Inv×Hu1×u)+(Hu2×u)],
  wherein u represents the user data, Hu1 represents the first vector, Hu2 represents the second vector, Hp11 Inv represents the third vector, and −Hp21 represents the fourth vector.

3. The data encoding system of claim 2, wherein each of Hu1, Hu2, Hp11 Inv and −Hp21 is a sparse circluant matrix.

4. The data encoding system of claim 1, wherein the output vector is a first output vector, and wherein the data encoder circuit is further operable to:
 multiply the first output vector by a fifth vector to yield a fifth interim vector; and
 multiply the fifth interim vector by a sixth vector to yield a second output vector.

5. The data encoding system of claim 4, wherein:
 multiplying the first output vector by the fifth vector to yield the fifth interim vector is done by a first vector multiplier circuit; and
 multiplying the fifth interim vector by the sixth vector to yield the second output vector is done by a second vector multiplier circuit.

6. The data encoding system of claim 4, wherein the sixth vector is a sparse circulant matrix and the fifth vector is a dense circulant matrix.

7. The data encoding system of claim 4, wherein the second output vector corresponds to the following equation:
 Second Output Vector=First Output Vector×Hp22×Hp12,
  wherein Hp22 represents the fifth vector, and Hp12 represents the sixth vector.

8. The data encoding system of claim 4, wherein the data encoder circuit is further operable to:
add the first interim vector to the second output vector to yield a sixth interim vector; and
multiply the sixth interim vector by the third vector to yield a third output vector.

9. The data encoding system of claim 8, wherein:
adding the first interim vector to the second output vector to yield a sixth interim vector is done by a vector adder circuit; and
multiplying the sixth interim vector by the third vector to yield the third output vector is done by a vector multiplier circuit.

10. The data encoding system of claim 8, wherein the third output vector corresponds to the following equation:
Third Output Vector=(Second Output Vector+First Interim Vector)×Hp11 Inv, wherein Hp11 Inv represents the third vector.

11. The data encoding system of claim 10, wherein the third output vector is a low density parity check codeword.

12. The data encoding system of claim 1, wherein the data encoding system is implemented as part of an electronic device selected from a group consisting of: a storage device, and a communication device.

13. The data encoding system of claim 1, wherein:
multiplying the user data input by the first vector to yield the first interim vector is done by a first vector multiplier circuit;
multiplying the user data input by the second vector to yield the second interim vector is done by a second vector multiplier circuit;
multiplying the first interim vector by the third vector to yield the third interim vector is done by a third vector multiplier circuit;
multiplying the third interim vector by the fourth vector to yield the fourth vector is done by a fourth vector multiplier circuit; and
adding the fourth interim vector to the second interim vector to yield the output vector is done by a vector adder circuit.

14. A method for multi-stage encoding, the method comprising:
receiving a user data input at a data encoding circuit;
multiplying the user data input by a first vector to yield a first interim vector in the data encoding circuit;
multiplying the user data input by a second vector to yield a second interim vector in the data encoding circuit;
multiplying the first interim vector by a third vector to yield a third interim vector in the data encoding circuit;
multiplying the third interim vector by a fourth vector to yield a fourth interim vector in the data encoding circuit;
adding the fourth interim vector to the second interim vector to yield an a fifth interim vector in the data encoding circuit;
multiplying the fifth interim vector by a fifth vector to yield a sixth interim vector in the data encoding circuit;
multiplying the sixth interim vector by a sixth vector to yield a seventh interim vector in the data encoding circuit;
adding the seventh interim vector to the first interim vector to yield an eighth interim vector in the data encoding circuit; and
multiplying the eighth interim vector by the third vector to yield an encoded output.

15. The method of claim 14, wherein the encoded output is a low density parity check codeword.

16. The method of claim 14, wherein the encoded output is a non-binary encoded output.

17. The method of claim 14, wherein the encoded output is a binary encoded output.

18. The method of claim 14, wherein the method further comprises:
programming a memory accessible to the data encoding circuit to hold the first vector, the second vector, the third vector, the fourth vector, the fifth vector, and the sixth vector.

19. The method of claim 18, wherein the fifth vector is a dense circulant matrix; and wherein each of the first vector, the second vector, the third vector, the fourth vector, and the sixth vector is a sparse circulant matrix.

20. A storage device, the storage device comprising:
a data encoder circuit operable to
receive a user data input at a data encoding circuit;
multiply the user data input by a first vector to yield a first interim vector in the data encoding circuit;
multiply the user data input by a second vector to yield a second interim vector in the data encoding circuit;
multiply the first interim vector by a third vector to yield a third interim vector in the data encoding circuit;
multiply the third interim vector by a fourth vector to yield a fourth interim vector in the data encoding circuit;
add the fourth interim vector to the second interim vector to yield an a fifth interim vector in the data encoding circuit;
multiply the fifth interim vector by a fifth vector to yield a sixth interim vector in the data encoding circuit;
multiply the sixth interim vector by a sixth vector to yield a seventh interim vector in the data encoding circuit;
add the seventh interim vector to the first interim vector to yield an eighth interim vector in the data encoding circuit;
multiply the eighth interim vector by the third vector to yield an encoded output,
a transmission circuit operable to store the encoded output to a storage medium.

* * * * *